United States Patent [19]

Okada

[11] Patent Number: 4,788,668

[45] Date of Patent: Nov. 29, 1988

[54] DYNAMIC TYPE MEMORY DEVICE INCLUDING A REFERENCE POTENTIAL GENERATING CIRCUIT ARRANGEMENT

[75] Inventor: Yoshio Okada, Tokyo, Japan

[73] Assignee: Kabushiki Kaisha Toshiba, Kawasaki, Japan

[21] Appl. No.: 824,647

[22] Filed: Jan. 31, 1986

[30] Foreign Application Priority Data

Feb. 1, 1985 [JP] Japan .................................. 60-18123

[51] Int. Cl.⁴ ........................ G11C 7/00; G11C 11/24
[52] U.S. Cl. .................................... 365/202; 365/189; 365/150
[58] Field of Search ............... 365/149, 182, 210, 222, 365/150, 202, 189

[56] References Cited

U.S. PATENT DOCUMENTS

| | | | |
|---|---|---|---|
| 4,379,346 | 4/1983 | Ochii et al. | 365/149 |
| 4,419,743 | 12/1983 | Taguchi et al. | 365/149 |
| 4,503,523 | 3/1985 | Cavaliere et al. | 365/149 |
| 4,547,868 | 10/1985 | Childers et al. | 365/210 |
| 4,578,776 | 3/1986 | Takemai et al. | 365/149 |

OTHER PUBLICATIONS

Lu et al., "Half-VDD Bit-Line Sensing Scheme in CMOS DRAM's," IEEE Journal of Solid-State Circuits, vol. SC-19, No. 4, Aug. 1984.

Nakano et al., "A Sub-100 ns 256K DRAM with Open Bit Line Scheme," IEEE Journal of Solid-State Circuits, vol. SC-18, No. 5, Oct. 1983.

Primary Examiner—Terrell W. Fears
Assistant Examiner—Melissa J. Kovac
Attorney, Agent, or Firm—Finnegan, Henderson, Farabow, Garrett, & Dunner

[57] ABSTRACT

A dynamic type memory device includes a plurality of one-transistor/one-capacitor type memory cells which are arranged in a matrix, first bit lines connected to the memory cells, second bit lines, and first capacitors respectively connected to the second bit lines and having a capacitance equal to ½ of that of the memory cell capacitor. This memory device further has second capacitors respectively connected to the second bit lines and having a capacitance equal to ½ of that of the memory cell capacitor, first switching transistors connected respectively between a power source terminal and the first capacitors, and second switching transistors connected respectively between a ground terminal and the second capacitors.

6 Claims, 4 Drawing Sheets

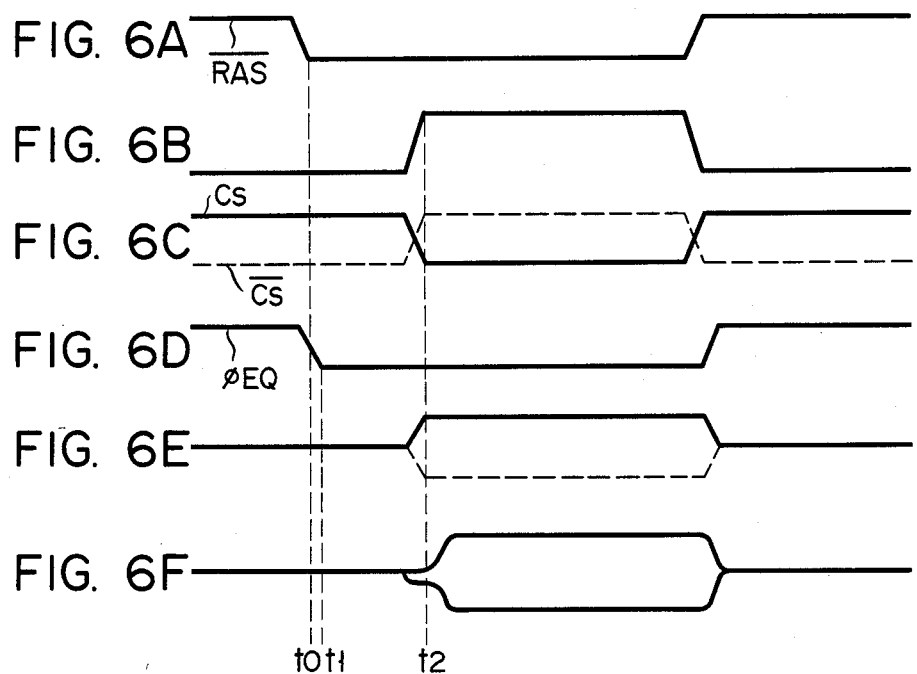
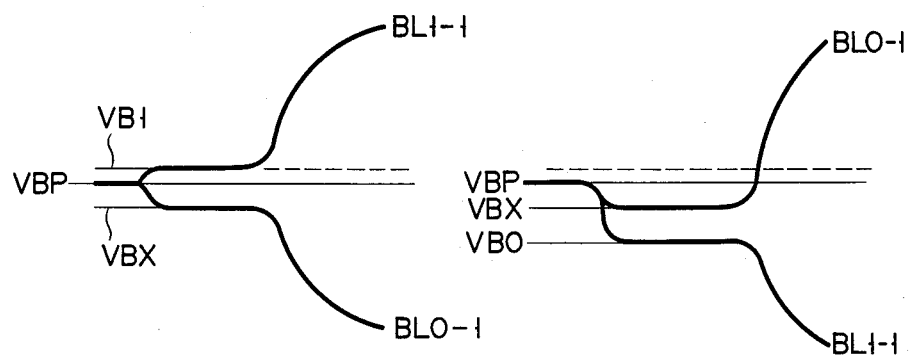

DYNAMIC TYPE MEMORY DEVICE INCLUDING A REFERENCE POTENTIAL GENERATING CIRCUIT ARRANGEMENT

BACKGROUND OF THE INVENTION

The present invention relates to a dynamic type memory device.

Generally, a dynamic type memory device in which bit lines are precharged to $\frac{1}{2}$ of a power source voltage VC in a precharge cycle is known. For example, as understood from part of this kind of memory device shown in FIG. 1, this memory device is constituted such that one end of each of paired bit lines BL and $\overline{BL}$ is connected to a sense amplifier 12, capacitor CS is connected to bit line $\overline{BL}$ through MOS transistor Q1 whose gate is connected to word line WL, and capacitor CD is connected to bit line $\overline{BL}$ through MOS transistor Q5 whose gate is connected to dummy word line DWL. The other terminals of capacitors CS and CD are connected to fixed voltage terminal VA. The other ends of bit lines BL and $\overline{BL}$ are connected to each other by MOS transistor Q2 and are respectively connected through MOS transistors Q3 and Q4 to a predetermined voltage line VCL which is kept at, for example, $\frac{1}{2}$ VC. An equalizing signal $\phi_{EQ}$ is supplied to gates of MOS transistors Q2 to Q4. Capacitors CS and CD are formed to have the same capacitance. MOS transistor Q1 and capacitor CS constitute a memory cell 11. MOS transistor Q5 and capacitor CD constitute a dummy cell 13.

The operation of the memory device shown in FIG. 1 will be described with reference to signal waveforms shown in FIGS. 2(A) to 2(E).

In this memory device, when equalizing signal $\phi_{EQ}$ is at a high level, MOS transistors Q2 to Q4 are made conductive and both bit lines BL and $\overline{BL}$ are precharged to the level of $\frac{1}{2}$ VC. After data is written into memory cell 11, the voltage of $\frac{1}{2}$ VC is written into dummy cell 13. After a row address strobe signal $\overline{RAS}$ is set to a low level at time t1 as shown in FIG. 2(A), when equalizing signal $\phi_{EQ}$ becomes low at time t2 as shown in FIG. 2(C), MOS transistors Q2 to Q4 are made non-conductive, so that bit lines BL and $\overline{BL}$ are isolated from each other. When the potentials of dummy word line DWL and word line WL are set to a high level as shown in FIGS. 2(D) and 2(B), the data in dummy cell 13 and memory cell 11 are read out and outputted onto bit lines BL and $\overline{BL}$ respectively, so that the potentials of bit lines BL and $\overline{BL}$ will change as shown in FIG. 2(E). The difference between the potentials of bit lines BL and $\overline{BL}$ is amplified by sense amplifier 12 and corresponding readout data is taken out from sense amplifier 12. Next, row address strobe signal $\overline{RAS}$ is set to a high level and the potential of word line WL is set to a low level and thereafter equalizing signal $\phi_{EQ}$ is set to a high level. Thus, MOS transistors Q2 to Q4 are made conductive and both potentials of bit lines BL and $\overline{BL}$ are set to $\frac{1}{2}$ VC. After the voltage of the $\frac{1}{2}$ VC level is written into dummy cell 13, the potential of dummy word line DWL is set low as shown in FIG. 2(D).

In the memory device shown in FIG. 1, to certainly write the voltage of $\frac{1}{2}$ VC into dummy cell 13, it is necessary to set dummy word line DWL to a high potential. A voltage step-up circuit needs to be connected to dummy word line DWL for this purpose, causing the structure of this memory device to be complicated. In addition, to write the voltage of $\frac{1}{2}$ VC into dummy cell 13, it is necessary to hold dummy word line DWL at a high level for a predetermined time as well even after row address strobe signal $\overline{RAS}$ is set to a high level. Therefore, a special control circuit is needed to control the potential of dummy word line DWL.

A memory device shown in FIG. 3 is constituted similarly to that shown in FIG. 1 except that dummy cell 13 and MOS transistors Q3 and Q4 are removed. This memory device operates in accordance with signal waveforms shown in FIGS. 4A to 4D. Namely, in this memory device, after row address strobe signal $\overline{RAS}$ is set at a low level as shown in FIG. 4(A), equalizing signal $\phi_{EQ}$ is set at a high level as shown in FIG. 4(C). Thereafter, when the potential of word line WL is set at a high level as shown in FIG. 4(B), the data in memory cell 11 is read out and outputted onto bit lines BL and $\overline{BL}$ and the potentials of bit lines BL and $\overline{BL}$ are changed in accordance with the data read out as shown in FIG. 4(D). By equalizing the potentials of bit lines BL and $\overline{BL}$ in initial time of each readout operation as described above, data can be read out without being influenced due to the fluctuation of the power source voltage. However, data readout operation cannot be started until the potentials of bit lines BL and $\overline{BL}$ are equalized after strobe signal $\overline{RAS}$ is set at a low level, so that the access time eventually becomes long.

SUMMARY OF THE INVENTION

It is an object of the present invention to provide a dynamic type memory device which can operate at a high speed with a simple constitution.

This object is accomplished by a dynamic type memory device comprising: a plurality of memory cells each including one transistor and one capacitor; N first bit lines each of which is connected to the memory cells on the same column; N second bit lines; a plurality of word lines connected to the memory cells on the same row; a power source terminal and a reference potential terminal; a plurality of first capacitors each having a capacitance of $\frac{1}{2}$ of that of each capacitor of the memory cells; a plurality of second capacitors each having a capacitance of $\frac{1}{2}$ of that of each capacitor of the memory cells; and potential setting circuits for connecting the power source terminal to the second bit lines through the plurality of respective first capacitors and connecting the reference potential terminal to the second bit lines through the respective second capacitors in the data readout mode.

According to the present invention, in place of dummy cells to hold a predetermined potential, the potential setting circuits for setting the potentials of the second bit lines through the first and second capacitors in a precharge cycle are used, so that it is not required to use any dummy word line. Therefore, there is no need to use any voltage step-up circuit and the structure of the memory device is simplified.

BRIEF DESCRIPTION OF THE DRAWINGS

FIGS. 6A to 6F are signal waveform diagrams for explaining the operation of the memory device shown in FIG. 5; and FIGS. 7A and 7B show changes of potentials of a pair of bit lines in the case where data "1" and "0" are read out from a memory cell shown in FIG. 5.

DETAILED DESCRIPTION OF THE PREFERRED EMBODIMENT

Figure 1:
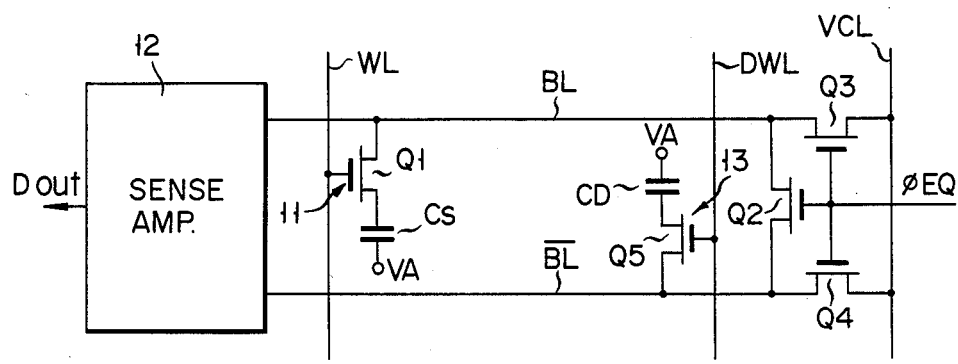
FIG. 1 is a circuit diagram of a conventional memory device.
Figure 2:
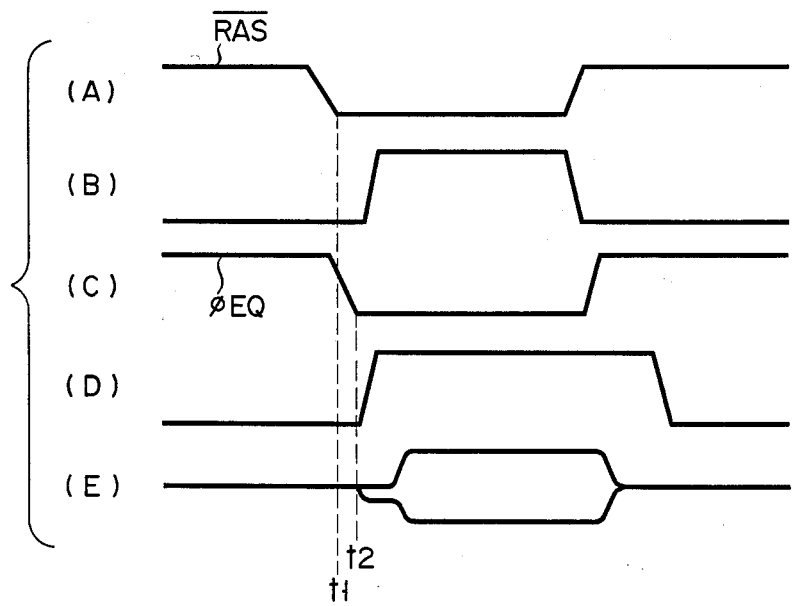
FIGS. 2(A) to 2(E) are signal waveform diagrams for explaining the operation of the memory device shown in FIG. 1.
Figure 3:
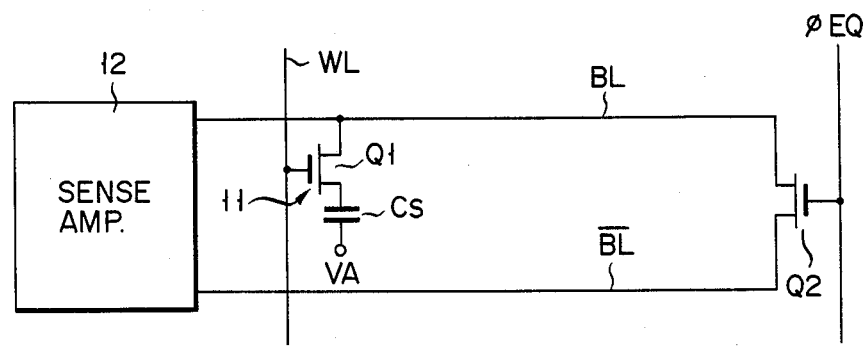
FIG. 3 is a circuit diagram of another conventional memory device.
Figure 4:
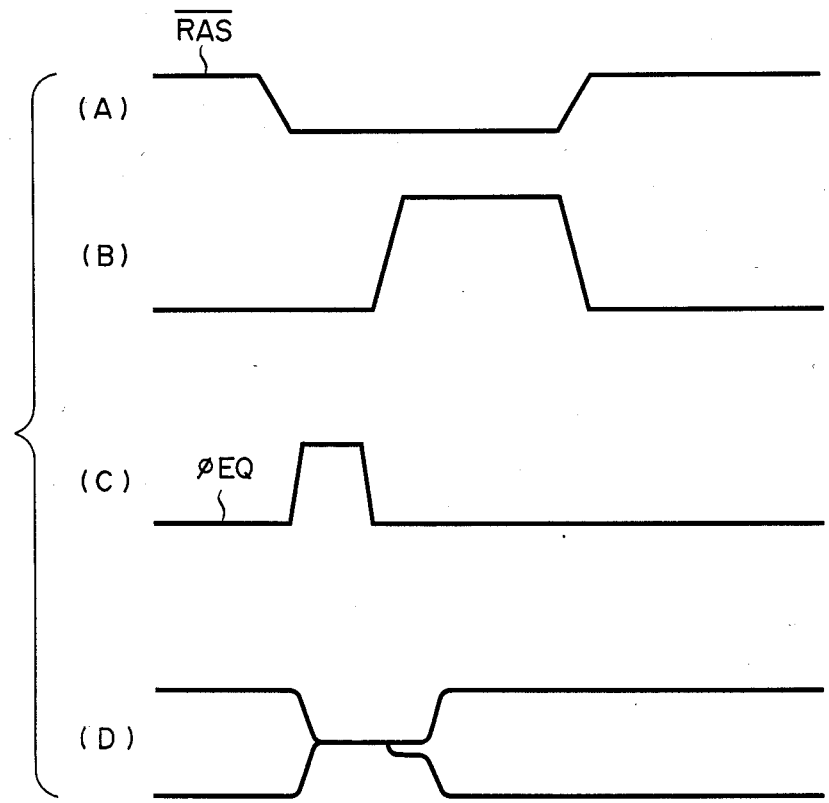
FIGS. 4(A) to 4(D) are signal waveform diagrams for explaining the operation of the memory device shown in FIG. 3.
Figure 5:
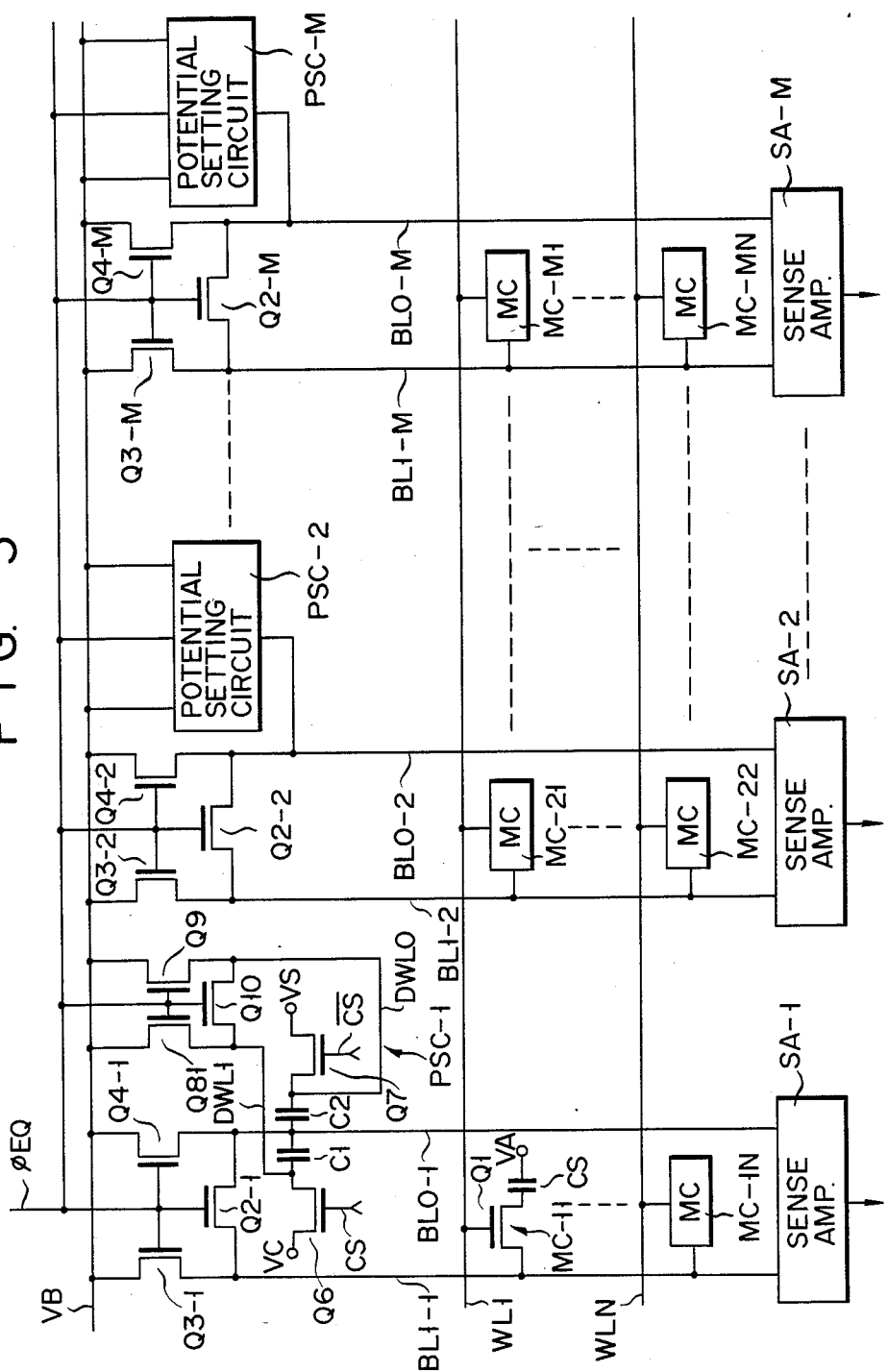
FIG. 5 is a circuit diagram of a dynamic type memory device according to an embodiment of the present invention.

FIG. 5 shows a dynamic type memory device according to an embodiment of the present invention. This memory device comprises memory cells MC-11 to MC-MN arranged in a matrix; word lines $WL_1$ to $WL_N$ each of which is connected to the memory cells on the same row; and a plurality of pairs of bit lines BL1-1 to BL1-M and BL0-1 to BL0-M each of which pairs is connected to the memory cells on the same column. Each memory cell has a capacitor CS one end of which is connected to bit line BL1-i through MOS transistor Q1 whose gate is connected to word line WLj and the other end of which is connected to a constant voltage terminal VA. The bit lines of each pair are connected to a corresponding one of sense amplifiers SA-1 to SA-M at one end, and at the other end these bit lines are connected to each other by a corresponding one of MOS transistors Q2-1 to Q2-M. Both ends of MOS transistors Q2-1 to Q2-M are respectively connected to a constant voltage line or precharge line VB through MOS transistors Q3-1 to Q3-M and MOS transistors Q4-1 to Q4-M. Equalizing signal $\phi_{EQ}$ is supplied to gates of those MOS transistors Q2-1 to Q2-M, Q3-1 to Q3-M, and Q4-1 to Q4-M.

Dummy cells or potential setting circuits PSC-1 to PSC-M are connected to bit lines BL0-1 to BL0-M in order to set the potentials of these bit lines. These potential setting circuits PSC-1 to PSC-M are constituted substantially in the same manner. A constitution of potential setting circuit PSC-1 will be described in detail. Potential setting circuit PSC-1 has capacitors $C_1$ and $C_2$ one end of which is connected to bit line BL0-1 and the other ends of which are respectively connected to power source terminal VC and a ground terminal VS through p- and n-channel MOS transistors $Q_6$ and $Q_7$. Control signals CS and $\overline{CS}$ are supplied to gates of MOS transistors $Q_6$ and $Q_7$, respectively. A connecting point of capacitor C1 and MOS transistor $Q_6$ is connected to constant voltage line VB through a dummy word line $DWL_1$ and a MOS transistor $Q_8$. A connecting point of capacitor $C_2$ and MOS transistor $Q_7$ is connected to constant voltage line VB through a dummy word line $DWL_0$ and a MOS transistor $Q_9$. A MOS transistor $Q_{10}$ is connected between dummy word lines $DWL_1$ and $DWL_0$. Equalizing signal $\phi_{EQ}$ is also supplied to gates of MOS transistors $Q_8$ to $Q_{10}$.

The operation of the memory device shown in FIG. 5 will be described with reference to FIGS. 6A to 6F and FIGS. 7A and 7B.

When row address strobe signal $\overline{RAS}$ becomes low at time t0 as shown in FIG. 6A and equalizing signal $\phi_{EQ}$ becomes low at time $t_1$ as shown in FIG. 6D, MOS transistors Q2-1 to Q2-M, Q3-1 to Q3-M, and Q4-1 to Q4-M, and MOS transistors $Q_8$ to $Q_{10}$ of each of potential setting circuits PSC-1 to PSC-M are made conductive, thereby setting this memory device into the accessible state. When the potential of one of word lines $WL_1$ to $WL_N$, for example, word line $WL_1$ is set to a high level at time t2 as shown in FIG. 6B and at the same time control signals CS and $\overline{CS}$ are set to low and high levels as shown by solid and broken lines in FIG. 6C, respectively, MOS transistors $Q_1$ of memory cells MC-11 to MC-M1 are made conductive and the data in these memory cells are read out and outputted onto bit lines BL1-1 to BL1-M. In this case, since MOS transistors $Q_6$ and $Q_7$ are conductive, the potentials of dummy word lines $DWL_1$ and $DWL_0$ are set to high and low levels as shown by solid and broken lines in FIG. 6E, respectively. Sense amplifiers SA-1 to SA-M amplify the difference between the potentials of bit lines BL1-1 to BL1-M and BL0-1 to BL0-M and set the potentials of these bit lines BL1-1 to BL1-M and BL0-1 to BL0-M as shown in FIG. 6F in accordance with the data read out from the memory cells.

In the case where data "1" is read out from memory cell MC-11, the potential of bit line BL1-1 changes from a precharge potential level VBP ($=\frac{1}{2}$ VC) to a potential level $VB_1$ which is given by the following equation as shown in FIG. 7A.

$$VB_1 = \frac{CB}{CB + CS} \cdot VBP + \frac{CS}{CB + CS} \cdot VC \quad (1)$$

where, CB is a stray capacitance associated with each of bit lines BL1-1 and BL0-1.

In the case where data "0" is read out from memory cell MC-11, the potential of bit line BL1-1 changes from VBP to a potential level $VB_0$ which is given by the following equation as shown in FIG. 7B.

$$VB_0 = \frac{CB}{CB + CS} \cdot VBP \quad (2)$$

After time t2, namely, after the potentials of dummy word lines DWL1 and DWL0 are set to high and low levels, respectively, the potential of bit line BL0-1 changes from VBM to VBX which is obtained by the following equations.

$$CB \cdot VBP = CB \cdot VBX + C_1 \cdot (VBX - VC) + C_2 \cdot VBX \quad (3)$$

$$C_1 = C_2 = \tfrac{1}{2} CS \quad (4)$$

By substituting equation (4) into equation (3), the following equation is derived.

$$VBX = \frac{CB}{CB + CS} \cdot VBP + \frac{\frac{1}{2} CS}{CB + CS} \cdot VC$$

Therefore, when data "0" or "1" is read out, the difference between the potentials of bit lines BL1-1 and BL0-1 becomes $$\frac{VC}{2} \cdot CS/(CB + CS).$$

Consequently, the same sense margin is obtained for the readout of data "1" and "0" irrespective of the level of precharge potential VBP.

As described above, according to the memory device shown in FIG. 5, the data read out from the memory cell is independent of the precharge potentials of the pair of bit lines at a time just before the readout operation and the variation ranges of the signal level in the case where data "0" and "1" are read out can be made substantially equal.

In addition, in this memory device, the potentials of the pair of bit lines can be equalized at a desired timing. In this case, since it takes a relatively long time for this equalizing operation, the bit lines can be precharged during this equalizing operation.

In the memory device shown in FIG. 5, potential setting circuit PSC-1 is constituted by CMOS transistors $Q_6$ and $Q_7$, n-channel MOS transistors $Q_8$ to $Q_{10}$, and capacitors $C_1$ and $C_2$, so that a large occupied area is unnecessary. In addition, since control signals CS and $\overline{CS}$ change synchronously with the potential change of word lines WL selected, these control signals CS and $\overline{CS}$ can be easily formed in accordance with the change in potential of word lines WL.

Although the invention has been described above with respect to one embodiment, the invention is not limited to only this embodiment. For example, although one end of capacitor CS of the memory cell is connected to constant voltage terminal VA in the embodiment, in place of this constitution, it may also be connected to voltage source terminal VCP to which a fluctuating voltage varying in accordance with fluctuation of power source voltage VC is applied. With this constitution, the influence on the readout data due to the fluctuation of power source voltage VC can be suppressed.

What is claimed:

1. A dynamic type memory device comprising:
   a plurality of memory cells each having one transistor and one capacitor;
   N first bit lines each of which is connected to the memory cells on the same column;
   N second bit lines;
   a plurality of word lines each of which is connected to the memory cells on the same row;
   a power source terminal to which a power source voltage is applied and a reference potential terminal which is kept at a reference potential;
   N first capacitors each having a first terminal directly connected to each of said second bit lines and a capacitance of ½ of each capacitor of said memory cells;
   N second capacitors each having a first terminal directly connected to each of the second bit lines and a capacitance of ½ of each capacitor of said memory cells; and
   potential setting means for connecting said power source terminal to said second bit lines through said first capacitors and also connecting said reference potential terminal to said second bit lines through said second capacitors to set the potentials of said second bit lines in a data readout mode.

2. A dynamic type memory device to claim 1, wherein said potential setting means includes a plurality of potential setting circuits each having first switching means, which is connected in series to one of said first capacitors between said power source terminal and a corresponding one of said second bit lines, and second switching means, which is connected in series to one of said second capacitors between said reference potential terminal and the corresponding one of said second bit lines.

3. A dynamic type memory device according to claim 2, further comprising a plurality of third switching means each of which is connected between a corresponding one of said first bit lines and the corresponding one of said second bit lines; a plurality of fourth switching means each of which is connected between a precharge line and the corresponding one of said first bit lines; and a plurality of fifth switching means each of which is connected between said precharge line and corresponding one of said second bit lines.

4. A dynamic type memory device according to claim 1, wherein said potential setting means includes a plurality of potential setting circuits each having first switching means connected between said power source terminal and a corresponding one of said first capacitors and second switching means connected between said reference potential terminal and a corresponding one of said second capacitors.

5. A dynamic type memory device according to claim 4, further comprising a plurality of third switching means each of which is connected between a corresponding one of said first bit lines and a corresponding one of said second bit lines; a plurality of fourth switching means each of which is connected between a precharge line and a corresponding one of said first bit lines; and a plurality of fifth switching means each of which is connected between said precharge line and a corresponding one of said second bit lines.

6. A dynamic type memory device according to claim 5, wherein each of said potential setting means further has sixth switching means connected between the other ends of said first and second capacitors and seventh and eighth switching means connected between the other ends of said first and second capacitors and said precharge line.

* * * * *